(12) United States Patent
Manabe

(10) Patent No.: US 6,326,651 B1
(45) Date of Patent: Dec. 4, 2001

(54) FIELD-PROGRAMMABLE GATE ARRAY WITH FERROELECTRIC THIN FILM

(75) Inventor: Yoshio Manabe, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/520,145

(22) Filed: Mar. 7, 2000

(30) Foreign Application Priority Data

Mar. 8, 1999 (JP) .................................................. 11-059769
Jun. 15, 1999 (JP) .................................................. 11-167722

(51) Int. Cl.[7] ........................ H01L 27/10; H01L 27/105; H03K 19/177; H03K 19/185
(52) U.S. Cl. ........................ 257/209; 257/295; 257/369; 326/41
(58) Field of Search .................................... 257/208, 209, 257/295; 326/39, 41

(56) References Cited

U.S. PATENT DOCUMENTS

| 5,198,706 | | 3/1993 | Papaliolios . | |
| 5,365,094 | * | 11/1994 | Takasu | 257/295 |
| 5,469,003 | | 11/1995 | Kean | 326/39 |
| 5,523,964 | * | 6/1996 | McMillan et al. | 257/295 |
| 5,561,307 | * | 10/1996 | Mihara et al. | 257/295 |
| 5,670,897 | | 9/1997 | Kean | 326/41 |
| 5,821,571 | * | 10/1998 | Shimoji | 257/295 |
| 5,909,042 | * | 6/1999 | Azuma et al. | 257/295 |
| 6,140,672 | * | 10/2000 | Arita et al. | 257/295 |

FOREIGN PATENT DOCUMENTS 10-4345    1/1998    (JP) .

* cited by examiner

*Primary Examiner*—Gene M. Munson
(74) *Attorney, Agent, or Firm*—Eric J. Robinson; Nixon Peabody LLP

(57) ABSTRACT

A field-programmable gate array of the present invention includes a program element for connecting/disconnecting first and second basic cells to/from each other responsive to a program externally input and for storing thereon the connection or disconnection state between the first and second cells. The program element includes: a switching device implemented as a CMOS circuit; and a nonvolatile memory device, which stores thereon the ON/OFF states of the switching device and includes a lower electrode, a capacitive insulating film made of a ferroelectric thin film, and an upper electrode. A first interlevel insulating film is formed over the switching device. And a buffer layer for matching a lattice constant of the first interlevel insulating film with that of the ferroelectric thin film is formed on the first interlevel insulating film.

7 Claims, 9 Drawing Sheets

FIELD-PROGRAMMABLE GATE ARRAY WITH FERROELECTRIC THIN FILM

BACKGROUND OF THE INVENTION

The present invention relates to a configurable cellular array of dynamically configurable logic elements, such arrays being generally known as a field-programmable gate array (FPGA). More particularly, the present invention relates to an FPGA including: first and second basic cells, each having a plurality of logic circuits; and a program element for connecting/disconnecting the first and second basic cells to/from each other responsive to a program externally input and storing thereon the connection or disconnection state between these cells. The present invention also relates to a method for fabricating such an FPGA.

An FPGA includes: a gate array, in which a multiplicity of basic cells, each having a plurality of logic circuits, are arranged to form a regular pattern: and an interconnection area, in which a plurality of interconnection lines are arranged to interconnect the basic cells together. In the FPGA, the connection or disconnection state of a line interconnecting a pair of basic cells is determined by a program element, which is controlled by a program.

Various types of program elements are known in the art. Examples of program elements include non-programmable types like anti-fuses, and programmable types like EEPROMs and EPROMS. Although EEPROMs and EPROMs are programmable a limited number of times (hereinafter, referred to as "programmability-limited program elements"), a program element disclosed in Japanese Laid-Open Publication No. 10-4345 is programmable any arbitrary number of times (hereinafter, referred to as "programmability-unlimited program elements"). The program element disclosed in this document includes: an SRAM; and a nonvolatile ROM for storing thereon logic synthesis data.

The non-programmable program elements and programmability-limited program elements can advantageously retain logic synthesis data even after the power has been turned OFF. But the program elements of these types are programmable just a limited number of times. In addition, although these program elements require the application of a high voltage to write data thereon, the resulting write speed is low. For example, a data write speed enabled by an EEPROM or EPROM is on the order of several milliseconds.

On the other hand, the program elements of the type disclosed in Japanese Laid-Open Publication No. 10-4345 are programmable an arbitrary number of times and data can be written thereon at a high speed, because the data stored on a ROM is written onto an SRAM. However, since the program element of this type uses the SRAM, data should be read out from the ROM every time the power is turned ON. Moreover, it is impossible to write logic synthesis data, other than the counterpart written on the ROM, onto the SRAM.

SUMMARY OF THE INVENTION

An object of the present invention is providing a field-programmable gate array, which includes a nonvolatile memory device retaining logic synthesis data thereon even after the power has been turned OFF and which is still programmable at a high speed with a low voltage applied, and a method for fabricating the same.

To achieve this object, a first exemplary field-programmable gate array according to the present invention includes: first and second basic cells, each of which includes a plurality of logic circuits and is formed on a semiconductor substrate; and a program element for connecting/disconnecting the first and second basic cells to/from each other responsive to a program externally input and for storing thereon the connection or disconnection state between the first and second cells. The program element includes: a switching device, which is formed on the semiconductor substrate and turns ON/OFF to connect/disconnect the first and second basic cells to/from each other; and a nonvolatile memory device for storing thereon the ON/OFF states of the switching device. The memory device includes: a lower electrode; a capacitive insulating film made of a ferroelectric thin film; and an upper electrode. An interlevel insulating film is formed over the first and second basic cells and the switching device. A buffer layer for matching a lattice constant of the interlevel insulating film with that of the ferroelectric thin film is formed on the interlevel insulating film. And the nonvolatile memory device is formed on the buffer layer.

In the first field-programmable gate array, the program element includes: a switching device turning ON/OFF to connect/disconnect the first and second basic cells to/from each other; and a nonvolatile memory device, which stores thereon the ON/OFF states of the switching device and includes a lower electrode, a capacitive insulating film made of a ferroelectric thin film, and an upper electrode. Accordingly, the connection/disconnection states between the first and second basic cells can be stored in a nonvolatile manner. In addition, the power required for programming can be drastically cut down and the programming time can also be shortened to the order of several hundred nanoseconds.

Moreover, a buffer layer for matching a lattice constant of the interlevel insulating film with that of the ferroelectric thin film is interposed between the interlevel insulating film and the nonvolatile memory device to improve the crystallinity of the ferroelectric thin film. Accordingly, the capacitive insulating film can be made of a ferroelectric thin film of improved quality, and therefore, the performance of the nonvolatile memory device can be enhanced.

To accomplish the above object, a second exemplary field-programmable gate array according to the present invention includes: first and second basic cells, each of which includes a plurality of logic circuits and is formed on a semiconductor substrate; and a program element for connecting/disconnecting the first and second basic cells to/from each other responsive to a program externally input and for storing thereon the connection or disconnection state between the first and second cells. The program element includes: a switching device, which is formed on the semiconductor substrate and turns ON/OFF to connect/disconnect the first and second basic cells to/from each other; and a nonvolatile memory device for storing thereon the ON/OFF states of the switching device. The memory device includes: a lower electrode; a capacitive insulating film made of a ferroelectric thin film; and an upper electrode. An interlevel insulating film is formed over the first and second basic cells and the switching device. An anti-diffusion layer is formed on the interlevel insulating film to prevent metal atoms in the ferroelectric thin film from diffusing into the interlevel insulating film. And the nonvolatile memory device is formed on the anti-diffusion layer.

In the second field-programmable gate array, the program element includes: a switching device turning ON/OFF to connect/disconnect the first and second basic cells to/from each other; and a nonvolatile memory device, which stores thereon the ON/OFF states of the switching device and includes a lower electrode, a capacitive insulating film made of a ferroelectric thin film, and an upper electrode. Accordingly, the connection/disconnection states between the first and second basic cells can be stored in a nonvolatile manner. In addition, the power required for programming can be drastically cut down and the programming time can also be shortened to the order of several hundred nanoseconds.

Moreover, an anti-diffusion layer for preventing metal atoms in the ferroelectric thin film from diffusing into the interlevel insulating film is formed between the interlevel insulating film and the nonvolatile memory device. Accordingly, even if the capacitive insulating film is formed to have its quality improved by depositing the ferroelectric thin film at an elevated temperature, the metal atoms contained in the ferroelectric thin film do not diffuse into the interlevel insulating film. Thus, it is possible to prevent the electrical characteristics of a transistor, which is a unit component of the first or second basic cell or the switching device, from deteriorating. As a result, the quality of the capacitive insulating film, which is made of the ferroelectric thin film, can be improved without deteriorating the electrical characteristics of the transistors implemented as the first and second basic cells and switching device.

In one embodiment of the present invention, the ferroelectric thin film is preferably made of lead zirconate titanate, barium titanate or bismuth strontium tantalate. And the lower electrode is preferably made of at least one of the group consisting of: platinum; ruthenium; rhenium; osmium; iridium; and a metal oxide thereof.

In such an embodiment, the performance of the nonvolatile memory device for storing thereon the ON/OFF states of the switching device can be enhanced with much more certainty.

In one embodiment of the first field-programmable gate array, the buffer layer may include first and second buffer layers, which are formed on the interlevel insulating film In this order. The first buffer layer is preferably made of titanium, titanium nitride, tungsten nitride or magnesium oxide. The second buffer layer is preferably made of lead lanthanum titanate or bismuth oxide. And the thickness of the second buffer layer is preferably 20 nm or less.

In such an embodiment, the crystallinity of the ferroelectric thin film can be improved with a lot more certainty.

In one embodiment of the second field-programmable gate array, the anti-diffusion layer is preferably made of silicon nitride, aluminum oxide or silicon oxynitride.

In such an embodiment, it is possible to prevent the metal atoms contained in the ferroelectric thin film from diffusing into the interlevel insulating film with a lot more certainty.

A first exemplary method according to the present invention is a method for fabricating a field-programmable gate array including: first and second basic cells, each including a plurality of logic circuits; and a program element including a switching device turning ON/OFF to connect/disconnect the first and second basic cells to/from each other responsive to a program externally input, and a nonvolatile memory device for storing thereon the ON/OFF states of the switching device responsive to the program externally input. The memory device includes: a lower electrode; a capacitive insulating film made of a ferroelectric thin film; and an upper electrode. The method includes the steps of: forming the first and second basic cells and the switching device on a semiconductor substrate; forming an interlevel insulating film over the first and second basic cells and the switching device; forming a buffer layer on the interlevel insulating film so as to match a lattice constant of the interlevel insulating film with that of the ferroelectric thin film; and forming the nonvolatile memory device on the buffer layer.

According to the first method, the nonvolatile memory device is formed over the interlevel insulating film, which covers the first and second basic cells and the switching device, with the buffer layer interposed therebetween. Accordingly, the buffer layer contributes to lattice matching between the interlevel insulating film and the ferroelectric thin film, thus improving the crystallinity of the ferroelectric thin film. As a result, the capacitive insulating film, which is made of the ferroelectric thin film, can have its quality improved, and therefore the performance of the nonvolatile memory device can be enhanced. A second exemplary method according to the present invention is a method for fabricating a field-programmable gate array including: first and second basic cells, each including a plurality of logic circuits; and a program element including a switching device turning ON/OFF to connect/disconnect the first and second basic cells to/from each other responsive to a program externally input, and a nonvolatile memory device for storing thereon the ON/OFF states of the switching device responsive to the program externally input. The memory device includes: a lower electrode; a capacitive insulating film made of a ferroelectric thin film; and an upper electrode. The method includes the steps of: forming the first and second basic cells and the switching device on a semiconductor substrate; forming an interlevel insulating film over the first and second basic cells and the switching device; forming an anti-diffusion layer on the interlevel insulating film so as to prevent metal atoms in the ferroelectric thin film from diffusing into the interlevel insulating film; and forming the nonvolatile memory device on the anti-diffusion layer.

According to the second method, the nonvolatile memory device is formed over the interlevel insulating film, which covers the first and second basic cells and the switching device, with the anti-diffusion layer interposed therebetween. Accordingly, even if the capacitive insulating film is formed to have its quality improved by depositing the ferroelectric thin film at an elevated temperature, the metal atoms contained in the ferroelectric thin film do not diffuse into the interlevel insulating film. Thus, it is possible to prevent the electrical characteristics of a transistor, which is a unit component of the first or second basic cell or the switching device, from deteriorating. As a result, the quality of the capacitive insulating film, which is made of the ferroelectric thin film, can be improved without degrading the electrical characteristics of the transistors implemented as the first and second basic cells and switching device.

As can be understood, the first or second field-programmable gate array uses a nonvolatile memory device, which can retain the logic synthesis data thereon after the power has been turned OFF, as a program element. Nevertheless, the first or second field-programmable gate array is still programmable at a high speed and with a reduced voltage applied thereto.

DESCRIPTION OF THE PREFERRED EMBODIMENTS

Hereinafter, preferred embodiments of an FPGA according to the present invention will be described.

Figure 1:
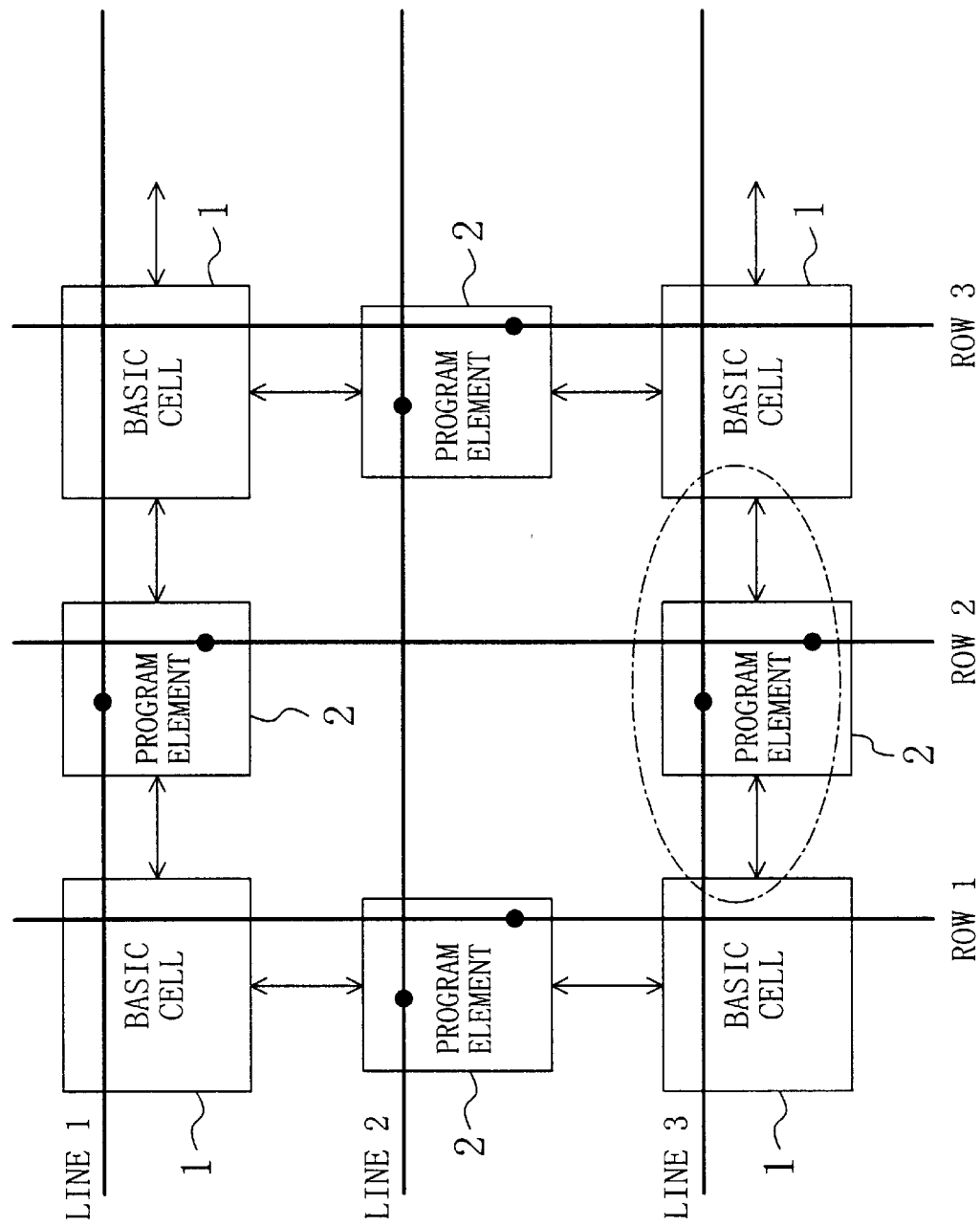
FIG. 1 is a schematic plan view illustrating an overall arrangement of an FPGA applicable to respective embodiments of the present invention.
Figure 2:
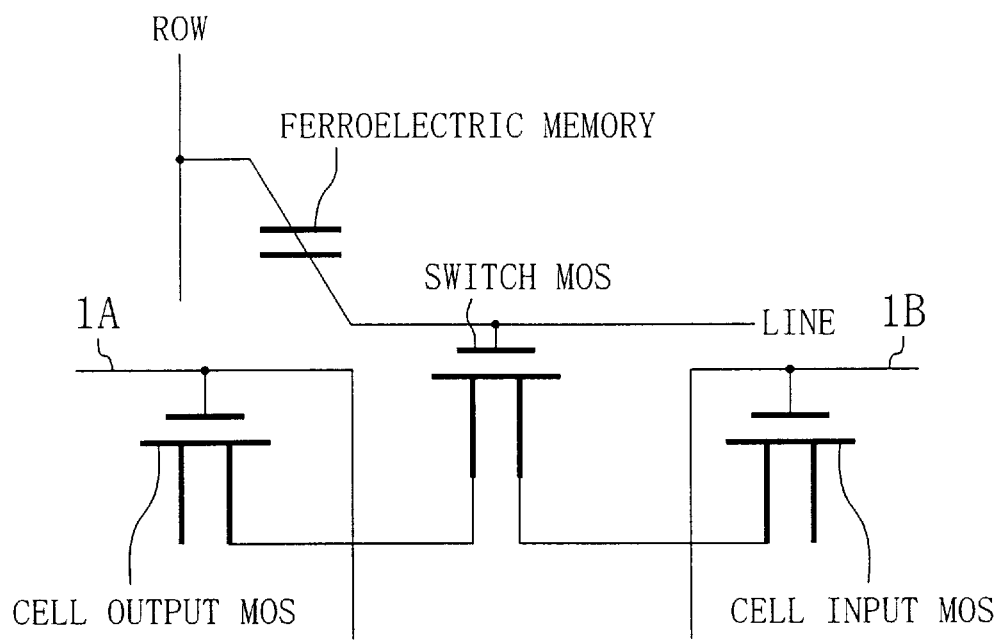
FIG. 2 is an equivalent circuit diagram of a portion encircled by a one-dot chain in FIG. 1.

First, an overall arrangement of the FPGA applicable to all of these embodiments, which constitutes a basic concept of the present invention, will be described with reference to FIGS. 1 and 2. FIG. 1 illustrates an overall arrangement of the FPGA, and FIG. 2 illustrates a portion encircled by a one-dot chain in FIG. 1.

For example, it should be noted that an FPGA according to the preferred embodiments of the present invention may be built in an imaging device like a charge coupled device (CCD) or a TV signal receiver, for example.

Also, the FPGA according to the embodiments of the present invention may be incorporated as a core logic device in an arithmetic logic unit such as a central processing unit (CPU). The CPU with the inventive FPGA built in is suitably applicable as an arithmetic logic unit for a computer.

Furthermore, the FPGA according to the embodiments of the present invention enables easily modifiable logic synthesis. Accordingly, such an FPGA may be built in a controller for use in various types of control operations, e.g., a microcontroller. The microcontroller with the inventive FPGA built in is suitably applicable as a controller for consumer electronic appliances, industrial equipment and illuminators.

As shown in FIG. 1, the FPGA includes a gate array, in which a multiplicity of basic cells 1, each including a plurality of logic circuits, are arranged to form a regular pattern. Each adjacent pair of basic cells 1 are interconnected via a program element 2, which includes: a switching device turning ON/OFF to connect/disconnect the basic cells 1 to/from each other; and a nonvolatile memory device for storing thereon the ON/OFF states of the switching device.

As shown in FIGS. 1 and 2, the switching device may be implemented as a switching MOS transistor SWITCH MOS and the nonvolatile memory device may be implemented as a ferroelectric memory FERROELECTRIC MEMORY. Each program element 2 including the MOS transistor and ferroelectric memory is controlled responsive to a combination of a line signal LINE 1, 2, 3, etc. and a row signal ROW 1, 2, 3, etc. The switching MOS transistor SWITCH MOS is connected between the output terminal of an MOS transistor CELL OUTPUT MOS and the input terminal of an MOS transistor CELL INPUT MOS. The MOS transistor CELL OUTPUT MOS is located at the output terminal of the first basic cell 1A on the transmitting end, while the MOS transistor CELL INPUT MOS is located at the input terminal of the second basic cell 1B on the receiving end. The ferroelectric memory FERROELECTRIC MEMORY is connected between the input terminal of the switching MOS transistor SWITCH MOS and a row signal ROW. It should be noted that the switching device does not have to be an MOS transistor, but may be a CMOS circuit, for example.

Figure 3:
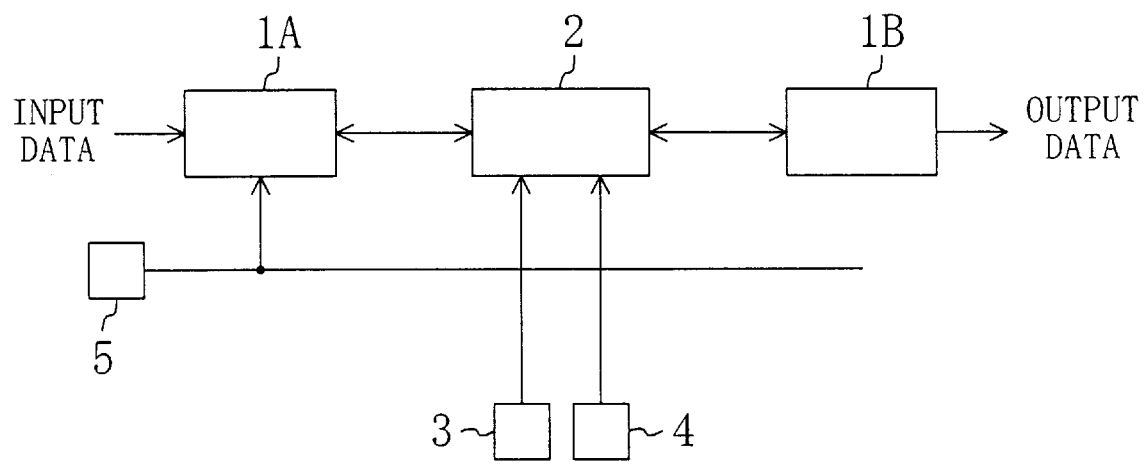
FIG. 3 is a block diagram illustrating a method for driving an FPGA applicable to respective embodiments of the present invention.

Hereinafter, a method for driving the FPGA will be described with reference to FIG. 3.

First, the program element 2 is externally selected using a line address encoder 3, thereby making the selected program element 2 write-enabled. Thereafter, data is externally input to the program element 2 using an input pin 4 for writing. It is determined responsive to a write pulse whether or not the data should be input to the program element 2. Then, the address, which has been determined by the line address encoder 3, is changed such that the data written on the program element 2 will not be altered. As a result, the program element 2 gets write-protected and the programming operation on the program element 2 ends.

Next, the first and second basic cells 1A and 1B are externally selected using a cell address encoder 5 during a normal operation, thereby making the first and second basic cells 1A and 1B write-enabled. Then, input data is externally written onto the first basic cell 1A, and the data written on the first basic cell 1A is transferred to the second basic cell 1B using the program element 2. The data, which has been transferred to the second basic cell 1B, is logically processed by the second basic cell 1B and then forwarded as output data to the outside.

In this exemplary case, the program element 2 is located between the first and second basic cells 1A and 1B and includes the switching device. Accordingly, the first and second basic cells 1A and 1B can be connected or disconnected to/from each other responsive to a program externally supplied. Furthermore, the program element 2 includes the ferroelectric memory as a nonvolatile memory device. Thus, the program element 2 can store thereon the ON/OFF states of the switching device and the connection/disconnection states between the first and second basic cells 1A and 1B even after the power has been turned OFF.

Thus, by using the first and second basic cells 1A and 1B and the program element 2 provided therebetween, the second basic cell 1B can be programmed (i.e., the functionality thereof is modifiable). And the modified functionality of the second basic cell 1B can be retained in a nonvolatile manner.

EMBODIMENT 1

Figure 4:
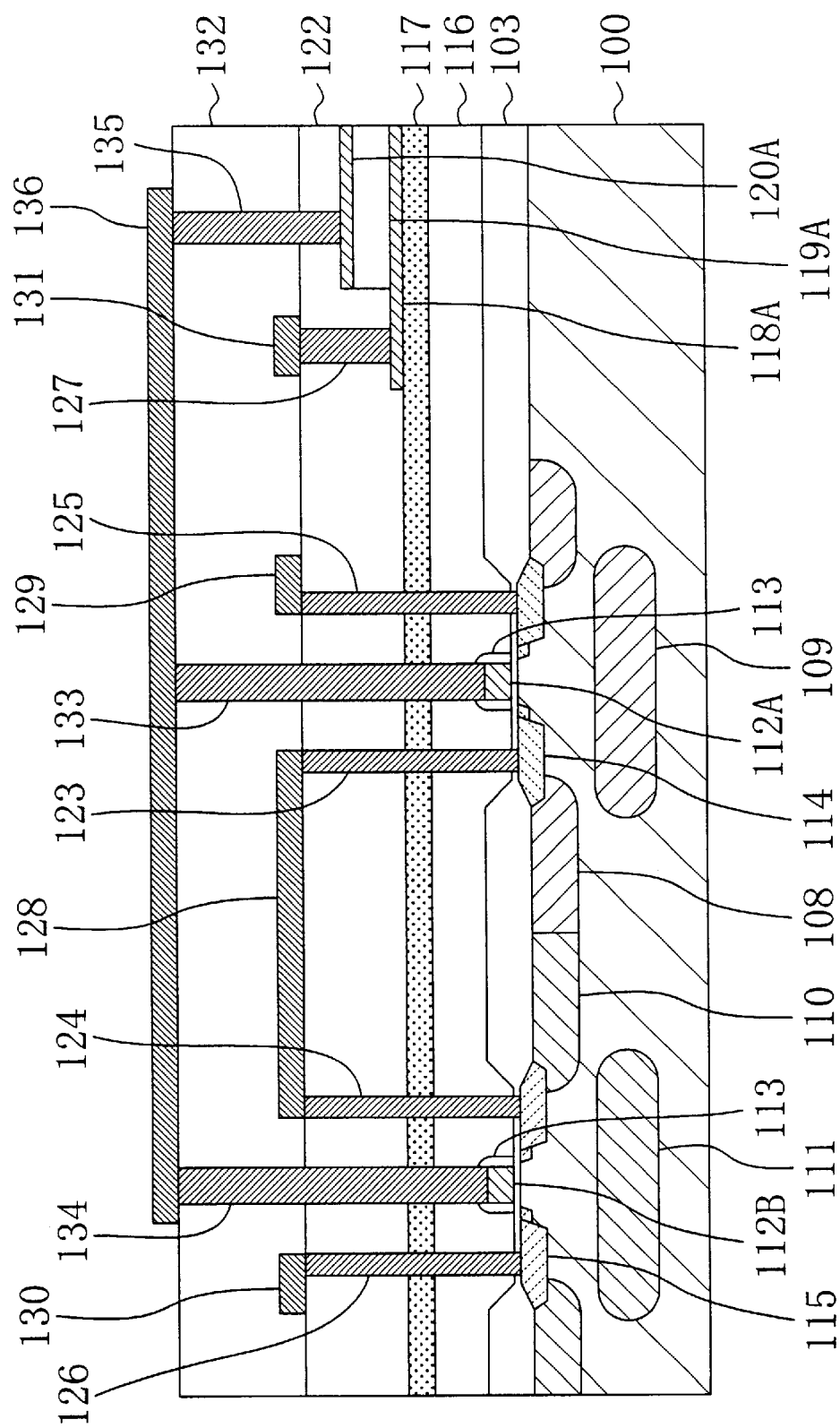
FIG. 4 is a cross-sectional view illustrating a principal portion of an FPGA according to a first embodiment of the present invention.

FIG. 4 illustrates a cross-sectional structure of the principal portion of an FPGA according to a first embodiment of the present invention. In the FPGA, the switching device and nonvolatile memory device are implemented as CMOS circuit and ferroelectric memory, respectively.

As shown in FIG. 4, LOCOS regions 103 as a field oxide a film and respective gate electrodes 112A and 112B of p- and n-channel MOS transistors are provided on a p-type silicon substrate 100. The gate electrodes 112A and 112B are covered with a passivation film 113 of silicon dioxide. In the silicon substrate 100, a p-type doped layer 114, functioning as source/drain regions with an LDD structure, is formed on right- and left-hand sides of the gate electrode 112A of the p-channel MOS transistor. A pair of n-wells 108 are provided to interpose the p-type doped layer 114 therebetween. And an n-type channel stopper 109 is formed under the p-type doped layer 114. In addition, in the silicon substrate 100, an n-type doped layer 115, functioning as source/drain regions with an LDD structure, is formed on right- and left-hand sides of the gate electrode 112B of the n-channel MOS transistor. A pair of p-wells 110 are provided to interpose the n-type doped layer 115 therebetween. And a p-type channel stopper region 111 is formed under the n-type doped layer 115.

The gate electrode 112A and the p-type doped layer 114 located on both sides thereof together constitute a p-channel MOS transistor, and the gate electrode 112B and the n-type doped layer 115 located on both sides thereof together constitute an n-channel MOS transistor. And the switching device of the program element is implemented as a CMOS circuit including these p- and n-channel MOS transistors.

It should be noted that the first and second basic cells 1A and 1B are also implemented on the silicon substrate 100 as respective CMOS circuits with the same structure as that of the CMOS circuit for the switching device, although not shown in FIG. 4.

A first interlevel insulating film 116 of TEOS, for example, is formed to cover the respective CMOS circuits as the first and second basic cells 1A and 1B and the switching device. A buffer layer 117, which is a multilayer structure formed by alternately stacking magnesium oxide and titanium films one upon the other, is formed on the first interlevel insulating film 116.

On the buffer layer 117, a lower electrode 118A made of a first platinum film, a capacitive insulating film 119A made of a ferroelectric thin film, and an upper electrode 120A made of a second platinum film are stacked in this order. And the lower electrode 118A, capacitive insulating film 119A and upper electrode 120A together constitute a nonvolatile memory device for the program element.

A second interlevel insulating film 122 is formed over the first interlevel insulating film 116, as well as over the nonvolatile memory device. First, second, third and fourth vias 123, 124, 125 and 126 are provided through the first and second interlevel insulating films 116 and 122. The first via 123 is interconnected to the drain region of the p-channel MOS transistor. The second via 124 is interconnected to the drain region of the n-channel MOS transistor. The third via 125 is interconnected to the source region of the p-channel MOS transistor. And the fourth via 126 is interconnected to the source region of the n-channel MOS transistor. A fifth via 127 is formed through the second interlevel insulating film 122 so as to be interconnected to the lower electrode 118A of the nonvolatile memory device. First, second, third and fourth metal interconnection lines 128, 129, 130 and 131 are formed on the second interlevel insulating film 122. The first metal interconnection line 128 Is connected to the first and second vias 123 and 124 and will be a signal output line of the CMOS circuit. The signal output line is connected to the input terminal of the second basic cell 1B. The second metal interconnection line 129 interconnects the third via 125 to a signal input line, which is connected to the output terminal of the first basic cell 1A. The third metal interconnection line 130 interconnects the fourth via 126 to a ground line. And the fourth metal interconnection line 131 interconnects the fifth via 127 to a row signal line.

A third interlevel insulating film 132 is formed on the second interlevel insulating film 122. Sixth and seventh vias 133 and 134 are formed through the first, second and third interlevel insulating films 116, 122 and 132. The sixth via 133 is interconnected to the gate electrode 112A of the p-channel MOS transistor. The seventh via 134 is interconnected to the gate electrode 112B of the n-channel MOS transistor. An eighth via 135 is formed through the second and third interlevel insulating films 122 and 132 so as to be interconnected to the upper electrode 120A of the nonvolatile memory device. And a fifth metal interconnection line 136 is formed on the third interlevel insulating film 132 to connect the sixth, seventh and eighth vias 133, 134, 135 together.

According to the first embodiment, the nonvolatile memory device includes the capacitive insulating film 119A made of a ferroelectric thin film. Thus, if a voltage equal to or higher than a threshold voltage is applied to the capacitive insulating film 119A, residual polarization exists even after the voltage applied reaches zero. That is to say, the nonvolatile memory device can retain the state when the voltage is applied.

Also, in this embodiment, the upper electrode 120A of the nonvolatile memory device is connected to the gate electrodes 112A and 112B of the CMOS circuit functioning as the switching device. The source region of the p-channel MOS transistor in the CMOS circuit is connected to the output terminal of the basic cell 1A. And the respective drain regions of the p- and n-channel MOS transistors in the CMOS circuit are connected to the input terminal of the second basic cell 1B. Accordingly, the connection/disconnection between the first and second basic cells 1A and 1B can be selectively defined by regulating the voltage applied to the gate electrodes 112A and 112B. Also, the connection/disconnection state selected may be stored on the nonvolatile memory device.

Moreover, according to the first embodiment, the first and second basic cells 1A and 1B can be selectively connected or disconnected by inverting the voltage applied to the gate electrodes 112A and 112B. Also, the connection/disconnection state reversed may be stored on the nonvolatile memory device.

Furthermore, according to the first embodiment, a buffer layer 117 is formed between the first interlevel insulating film 116 of TEOS formed over the CMOS circuits and the lower electrode 118A of the nonvolatile memory device. The buffer layer 117 is provided to match a lattice constant of the first interlevel insulating film 116 (TEOS film) with that of the capacitive insulating film 119A (ferroelectric thin film 119). Accordingly, the quality of the capacitive insulating film 119A, which is made of the ferroelectric thin film 119, can be improved, and therefore the performance of the nonvolatile memory device can be enhanced. The reason is as follows. The TEOS film as the first interlevel insulating film 116 is in an amorphous state. Thus, if the ferroelectric thin film 119 is grown over the TEOS film with the first platinum film 118 interposed therebetween, then the quality of the ferroelectric thin film 119 deteriorates. However, if the buffer layer 117 with a lattice constant closer to that of the ferroelectric thin film 119 is formed between the TEOS film and the first platinum film 118, then the crystallinity of the first platinum film 118 and the ferroelectric thin film 119 can be improved. As a result, the quality of the capacitive insulating film 19A, which is made of the ferroelectric thin film 119, can be improved. It is noted that the first platinum film 118 transmits the non-crystallinity of the underlying film (i.e., the TEOS film) to the overlying film (i.e., the ferroelectric thin film 119) as it is.

For example, suppose a lead zirconate titanate film is formed as the ferroelectric thin film 119 by sputtering. The present inventors examined, by X-ray diffraction analysis, respective cross sections of a lead zirconate titanate film deposited on a silicon oxide film (e.g., the TEOS film) and another lead zirconate titanate film formed over the silicon oxide film (e.g., the TEOS film) with a magnesium oxide film (i.e., the buffer layer) interposed therebetween. In the film of the former type, peaks of diffraction intensities were observed at (110) and other planes, as well as at (100) planes. On the other hand, in the film of the latter type, very high peaks of diffraction intensity were observed mainly at (100) planes.

Hereinafter, a method for fabricating the FPGA according to the first embodiment will be described with reference to FIGS. 5(a) through 5(c), FIGS. 6(a) through 6(c), FIGS. 7(a) and 7(b) and FIGS. 8(a) and 8(b).

Figure 5A:
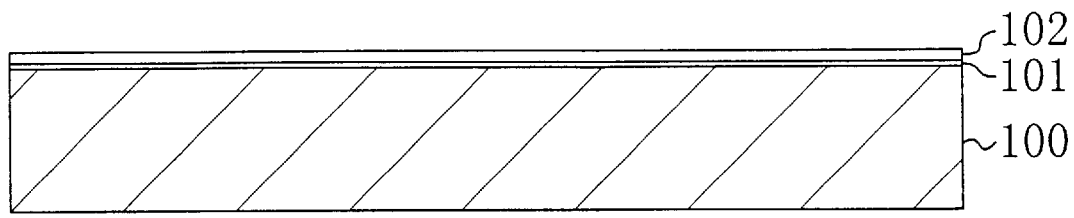
FIGS. 5(a) through 5(c) are cross-sectional views illustrating respective process steps for fabricating the FPGA according to the first embodiment.

First, as shown in FIG. 5(a), a silicon dioxide film 101 and a silicon nitride film 102 are stacked in this order on a p-type silicon substrate 100.

Figure 5B:
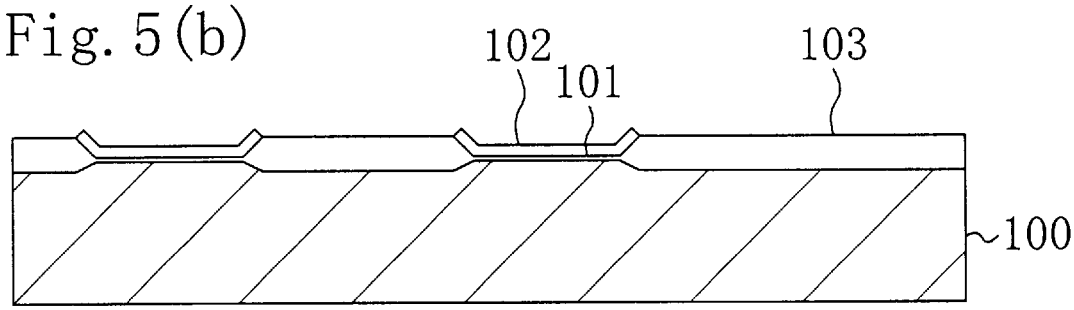

Next, as shown in FIG. 5(b), the silicon nitride film 102 is etched away except for its portions where MOS transistors are to be formed, and then the silicon dioxide film 101 is annealed and thermally oxidized, thereby forming the LOCOS regions 103 as a field oxide film. Thereafter, the silicon nitride film 102 and the silicon dioxide film 101 are removed, and then a silicon dioxide film 101 is formed again between the LOCOS regions 103.

Figure 5C:
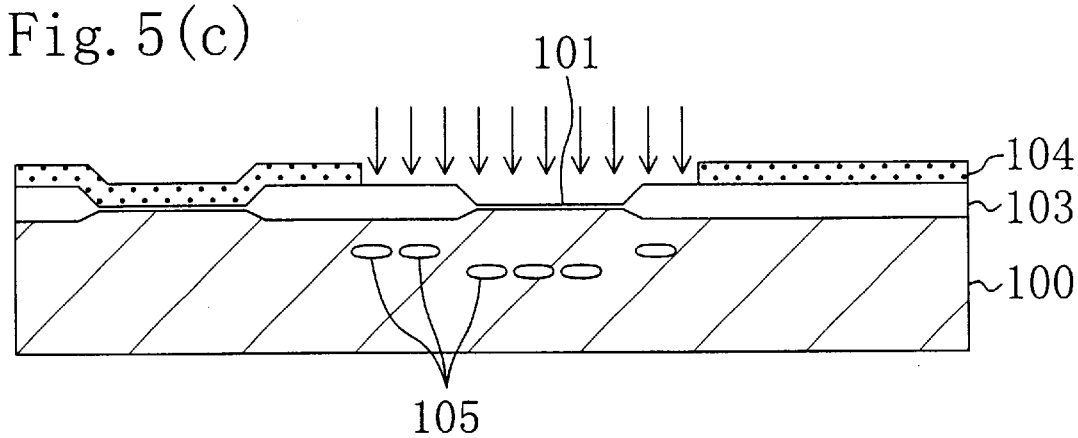

Subsequently, as shown in FIG. 5(c), phosphorus ions are implanted into the silicon substrate 100 using a first resist pattern 104 (which has an opening over a region where the p-channel MOS transistor should be formed) as a mask, thereby forming n-type doped regions 105.

Figure 6A:
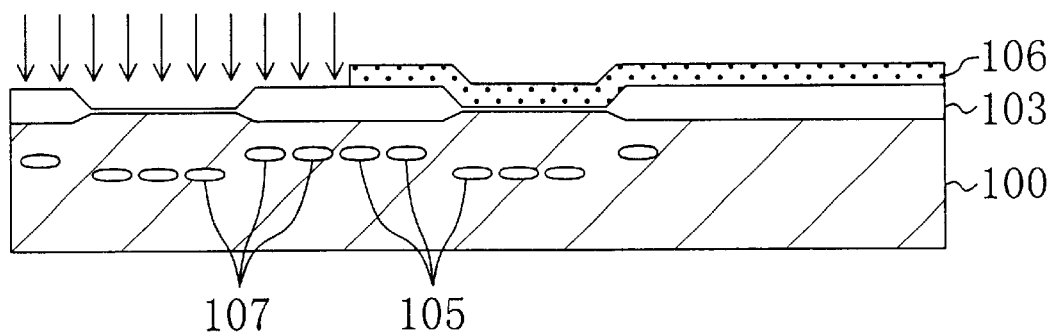
FIGS. 6(a) through 6(c) are cross-sectional views illustrating respective process steps for fabricating the FPGA according to the first embodiment.

Next, as shown in FIG. 6(a), boron ions are implanted into the silicon substrate 100 using a second resist pattern 106 (which has an opening over a region where the n-channel MOS transistor should be formed) as a mask, thereby forming p-type doped regions 107.

Figure 6B:
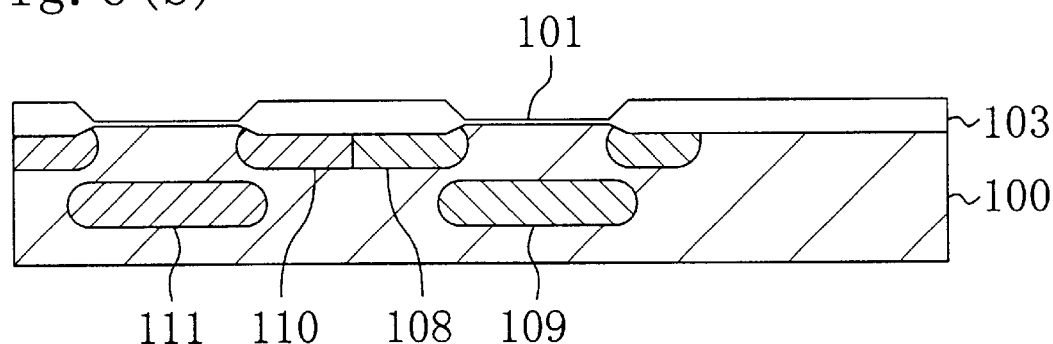

Subsequently, the silicon substrate 100 is annealed, thereby forming the n-well regions 108, n-type channel stopper region 109, p-well regions 110 and p-type channel stopper region 111 as shown in FIG. 6(b). Thereafter, the silicon dioxide film 101 is once removed and then a silicon dioxide film 101 to be a gate insulating film is formed again between the LOCOS regions 103.

Figure 6C:
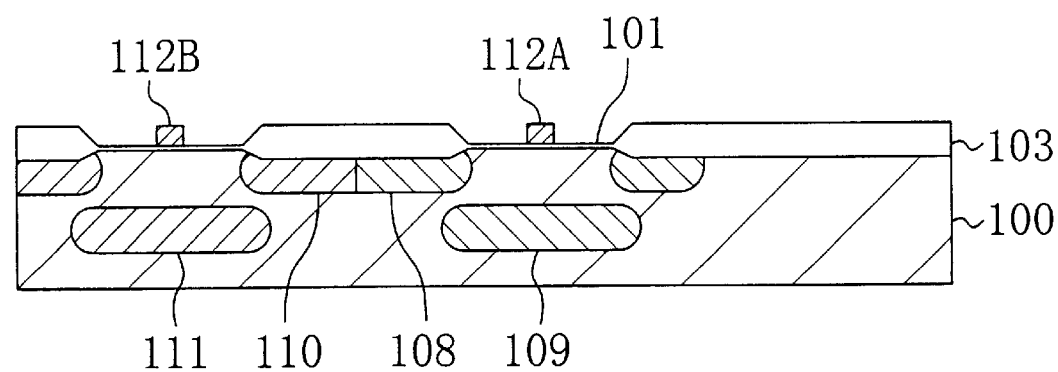

Next, a polysilicon film is deposited over the entire surface of the silicon substrate 100 and patterned, thereby forming the gate electrodes 112A and 112B for the p- and n-channel MOS transistors as shown in FIG. 6(c).

Figure 7A:
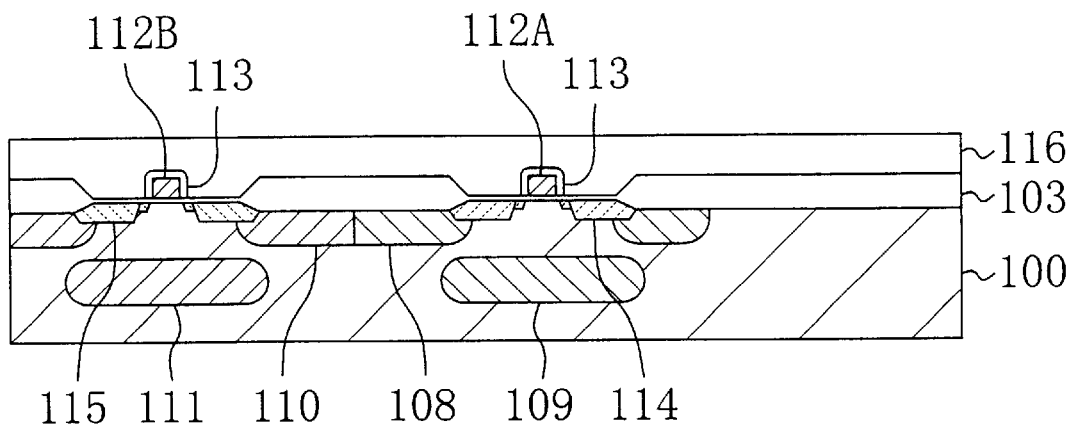
FIGS. 7(a) and 7(b) are cross-sectional views illustrating respective process steps for fabricating the FPGA according to the first embodiment.

Thereafter, as shown in FIG. 7(a), boron ions are implanted into the substrate using the gate electrode 112A as a mask, and then implanted thereto again using the gate electrode 112A and the passivation film 113 of silicon dioxide as a mask, thereby forming the p-type doped layer 114 with an LDD structure in the region where the p-channel MOS transistor should be formed. Also, phosphorus ions are implanted into the substrate using the gate electrode 112B as a mask, and then implanted thereto again using the gate electrode 112B and the passivation film 113 as a mask, thereby forming the n-type doped layer 115 with an LDD structure in the region where the n-channel MOS transistor should be formed. In this manner, the p- and n-channel MOS. transistors are formed to constitute a CMOS circuit as a switching device for the program element.

Although not shown, the CMOS circuits for the first and second basic cells 1A and 1B are also formed by performing the same process steps as those for the CMOS circuit as the switching device.

Subsequently, the first interlevel insulating film 116 of TEOS is deposited over the entire surface of the silicon substrate 100 to a thickness of 1 μm, and then has its surface planarized.

Figure 7B:
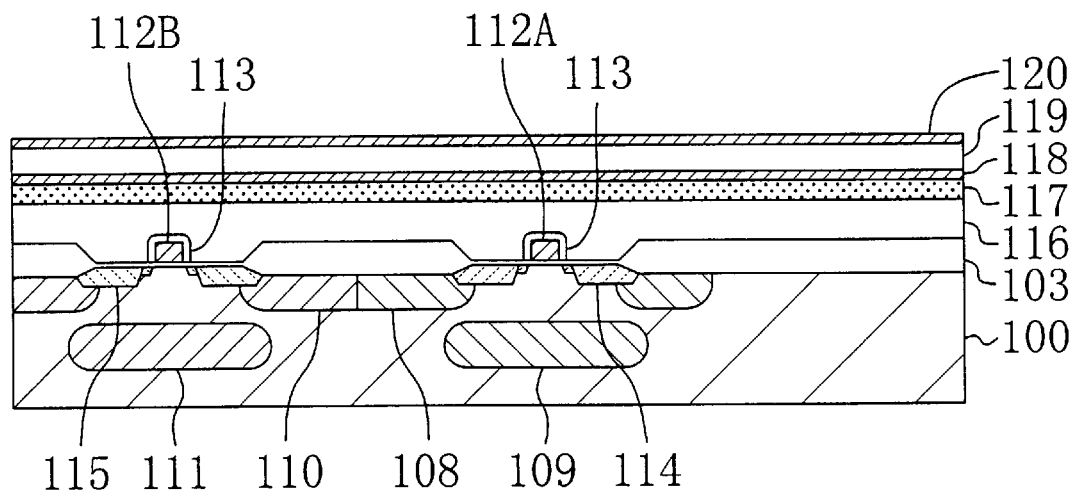

Then, as shown in FIG. 7(b), the buffer layer 117 is formed on the TEOS film 116 by alternately stacking magnesium oxide films with a thickness of 200 nm and titanium films with a thickness of 100 nm thereon by a sputtering technique.

Thereafter, a first platinum film 118 is formed to be 200 nm thick on the buffer layer 117, and then a ferroelectric thin film 119 of bismuth strontium tantalate ($SrBi_2Ta_2O_9$) is formed to be 600 nm thick on the first platinum film 118 by an RF sputtering technique. The temperature of the substrate (deposition temperature) is set at 700° C. during the deposition of the ferroelectric thin film 119. Next, a second platinum film 120 is deposited to be 200 nm thick on the ferroelectric thin film 119 by a sputtering technique.

Figure 8A:
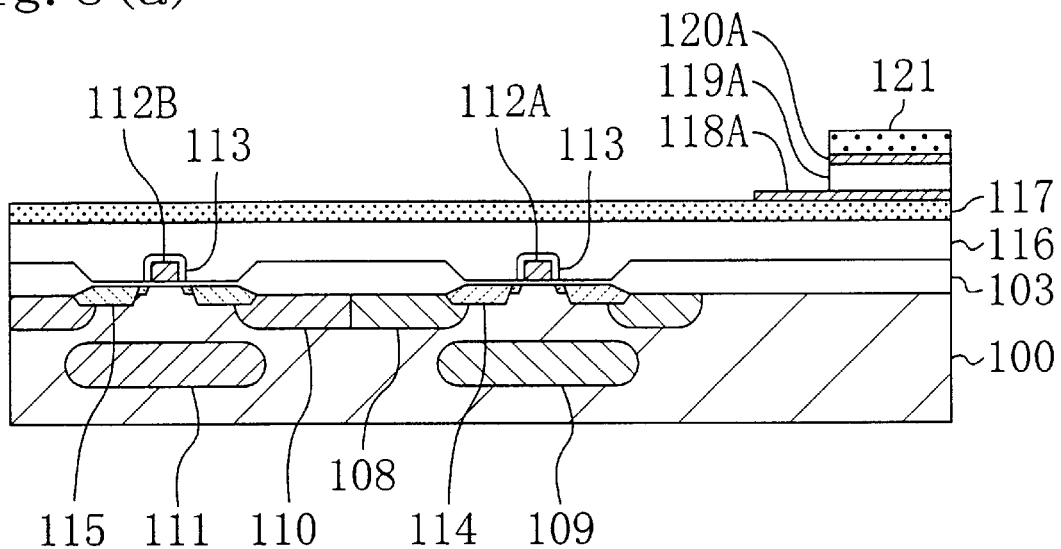
FIGS. 8(a) and 8(b) are cross-sectional views illustrating respective process steps for fabricating the FPGA according to the first embodiment.
Figure 8B:
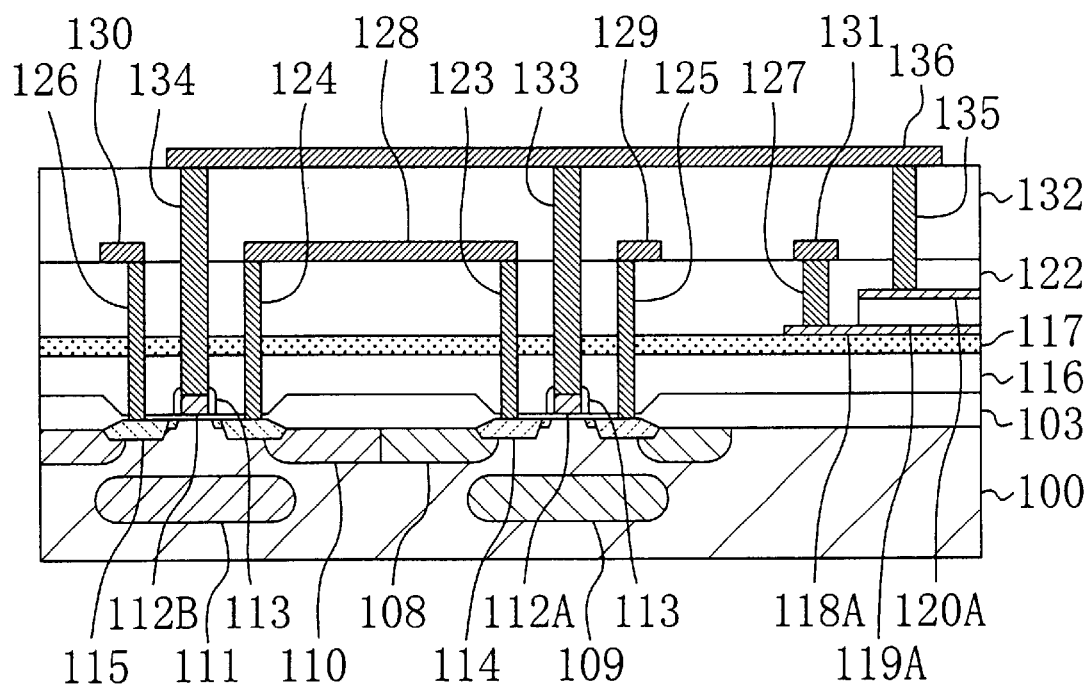

Subsequently, as shown in FIG. 8(a), the first platinum film 118 is dry-etched using a resist pattern (not shown) as a mask, thereby forming the lower electrode 118A out of the first platinum film 118. Thereafter, the ferroelectric thin film 119 and the second platinum film 120 are dry-etched using a third resist pattern 121 as a mask, thereby forming the upper electrode 120A out of the second platinum film 120 and the capacitive insulating film 119A out of the ferroelectric thin film 119. In this manner, a nonvolatile memory device for a program element is formed to include the lower electrode 118A, capacitive insulating film 119A and upper electrode 120A. The ferroelectric thin film 119 are preferably etched under the conditions that argon gas is used as an etching gas, the pressure inside the chamber is regulated at 0.2 Pa and a voltage of 1 kW is applied to the counter electrode.

Next, the second interlevel insulating film 122 is formed over the first interlevel insulating film 116, as well as over the nonvolatile memory device. Thereafter, the first, second, third and fourth vias 123, 124, 125 and 126 are formed through the first and second interlevel insulating films 116 and 122 to be interconnected to the drain of the p-channel MOS transistor, drain of the n-channel MOS transistor, source of the p-channel MOS transistor, and source of the n-channel MOS transistor, respectively. Also, the fifth via 127 is formed through the second interlevel insulating film 122 so as to be interconnected to the lower electrode 118A of the nonvolatile memory device. Next, the first metal interconnection line 128 is formed on the second interlevel insulating film 122 so as to be connected to the first and second vias 123 and 124 and to be a signal output line of the CMOS circuit. The second metal interconnection line 129 is formed on the second interlevel insulating film 122 so as to interconnect the third via 125 to a signal input line. The third metal interconnection line 130 is formed on the second interlevel insulating film 122 so as to interconnect the fourth via 126 to a ground line. And the fourth metal interconnection line 131 is formed on the second interlevel insulating film 122 so as to interconnect the fifth via 127 to a row signal line.

Subsequently, the third interlevel insulating film 132 is formed on the second interlevel insulating film 122. Thereafter, the sixth and seventh vias 133 and 134 are formed through the first, second and third interlevel insulating films 116, 122 and 132 so as to be interconnected to the gate electrodes 112A and 112B of the p- and n-channel MOS transistors, respectively. And the eighth via 135 is formed through the second and third interlevel insulating films 122 and 132 so as to be interconnected to the upper electrode 120A of the nonvolatile memory device. Next, the fifth metal interconnection line 136 is formed on the third interlevel insulating film 132 to connect the sixth, seventh and eighth vias 133, 134 and 135 together. In this manner, the FPGA according to the first embodiment shown in FIG. 4 is completed.

According to the fabrication method described above, a ferroelectric thin film 119 of good quality can be formed over the first interlevel insulating film 116 covering the respective CMOS circuits.

Also, since the ferroelectric thin film 119 is formed before the metal interconnection lines are formed. Accordingly, compared to forming the ferroelectric thin film 119 after the metal lines have been formed, the deposition temperature of the ferroelectric thin film 119 can be raised, thus improving the quality of the ferroelectric thin film 119.

In the foregoing embodiment, the buffer layer 117 is a multilayer film formed by alternately stacking magnesium oxide and titanium films one upon the other. Alternatively, the buffer layer 117 may be a single- or multi-layered film including at least one of titanium, titanium nitride, tungsten nitride and magnesium oxide films or a mixture thereof.

Also, the ferroelectric thin film 119 is made of bismuth strontium tantalate in the foregoing embodiment, but may be made of lead zirconate titanate ($Pb(Zr_{1-x}Ti_x)O_3$, where 0<x<1) or barium titanate ($BaTiO_3$).

The ferroelectric thin film 119 is formed by a sputtering technique in the foregoing embodiment. Optionally, the ferroelectric thin film 119 may also be deposited by a CVD process, in which alkoxides of respective constituent metals of bismuth strontium tantalate are vaporized at a ratio corresponding to the composition thereof and supplied onto the first platinum film 118 to be the lower electrode 118A.

Moreover, the lower electrode 118A may be made of a single- or multi-layered film including at least one of ruthenium (Ru), rhenium (Re), osmium (Os), iridium (Ir) and their oxides or mixed oxides, not the first platinum film 118.

Similarly, the upper electrode 120A may also be made of a single- or multi-layered film including at least one of ruthenium, rhenium, osmium, iridium, titanium and their oxides or mixed oxides, not the second platinum film 120.

EMBODIMENT 2

Figure 9:
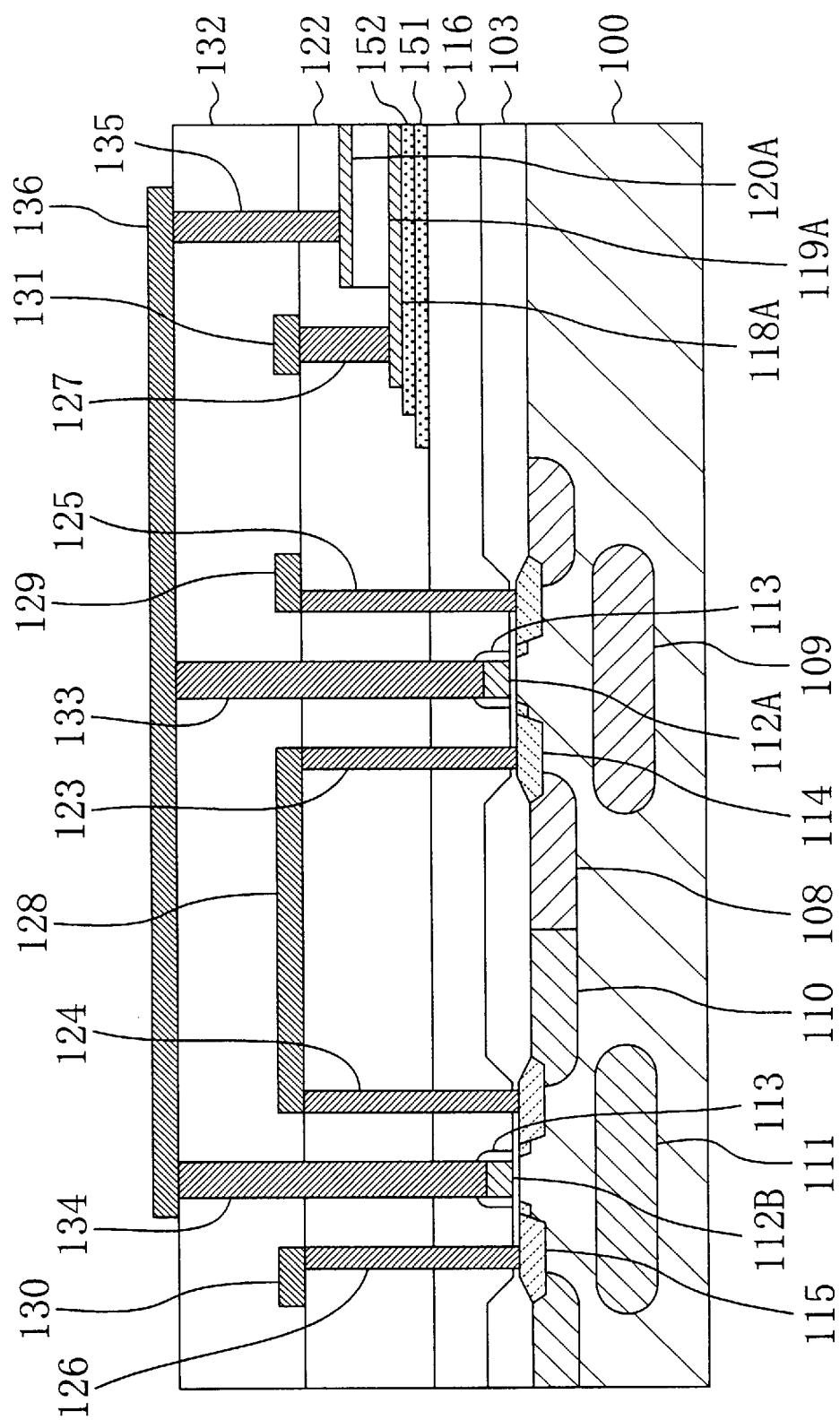
FIG. 9 is a cross-sectional view illustrating a principal portion of an FPGA according to a second embodiment of the present invention.

FIG. 9 illustrates a cross-sectional structure of the principal portion of an FPGA according to a second exemplary embodiment of the present invention, in which the switching device and nonvolatile memory device are implemented as CMOS circuit and ferroelectric memory, respectively.

In describing the second embodiment, the same components as those of the first embodiment shown in FIG. 4 are identified by the same reference numerals, and the description thereof will be omitted herein.

According to the second embodiment, first and second buffer layers 151 and 152 are formed between the first interlevel insulating film 116 of TEOS and the lower electrode 118A of the nonvolatile memory device. The lattice constant of the second buffer layer 152 is even closer to that of the ferroelectric thin film 119 than the lattice constant of the first buffer layer 151 is.

The first buffer layer 151 is preferably made of titanium, titanium nitride, tungsten nitride or magnesium oxide.

A preferable material for the second buffer layer 152 differs depending on the material of the ferroelectric thin film 119. Specifically, if the ferroelectric thin film 119 is made of lead zirconate titanate or barium titanate, then the second buffer layer 152 is preferably made of lead lanthanum titanate. On the other hand, if the ferroelectric thin film 119 is made of bismuth strontium tantalate, then the second buffer layer 152 is preferably made of bismuth oxide.

According to the second embodiment, the first and second buffer layers 151 and 152 are formed with respective lattice constants getting closer to that of the ferroelectric thin film 119 in this order. Thus, the quality of the capacitive insulating film 119A made of the ferroelectric thin film 119 can be further improved. The TEOS film as the first interlevel insulating film 116 is in an amorphous state. Thus, if the ferroelectric thin film 119 is grown over the TEOS film with the first platinum film 118 interposed therebetween, then the quality of the ferroelectric thin film 119 deteriorates. However, if the first and second buffer layers 151 and 152 with respective lattice constants getting closer in this order to that of the ferroelectric thin film 119 are formed between the TEOS film and the first platinum film 118, then the crystallinity of the first platinum film 118 and the ferroelectric thin film 119 can be further improved. As a result, the quality of the capacitive insulating film 119A, which is made of the ferroelectric thin film 119, can be further improved. In particular, if the thickness of the second buffer layer 152 is 20 nm or less, the quality of the capacitive insulating film 119A can be improved with much more certainty.

For example, suppose a bismuth strontium tantalate film is formed as the ferroelectric thin film 119 by sputtering. The present inventors examined, by X-ray diffraction analysis, the respective cross sections of a bismuth strontium tantalate film deposited directly on a silicon oxide film (e.g., the TEOS film) and another bismuth strontium tantalate film formed over the silicon oxide film (e.g., the TEOS film) with the first buffer layer 151 of magnesium oxide and the second buffer layer 152 of bismuth oxide interposed therebetween. In the film of the former type, peaks of diffraction intensities were observed at (110) and other planes, as well as at (100) planes. On the other hand, in the film of the latter type, very high peaks of diffraction intensity were observed mainly at (100) planes. This is because the lattice constant of the ferroelectric thin film 119 is even closer to that of the second buffer layer 152, since the first and second buffer layers 151 and 152 are formed with respective lattice constants getting closer to that of the ferroelectric thin film 119. In this case, the thickness of the second buffer layer 152 is set at 20 nm or less. This is because if the thickness of the second buffer layer 152 exceeds 20 nm, then the second buffer layer 152 comes to have its intrinsic lattice constant.

Even when the ferroelectric thin film 119 is made of lead zirconate titanate and the second buffer layer 152 is made of lead lanthanum titanate, the quality of the capacitive insulating film 119A made of the ferroelectric thin film 119 can also be further improved.

EMBODIMENT 3

Figure 10:
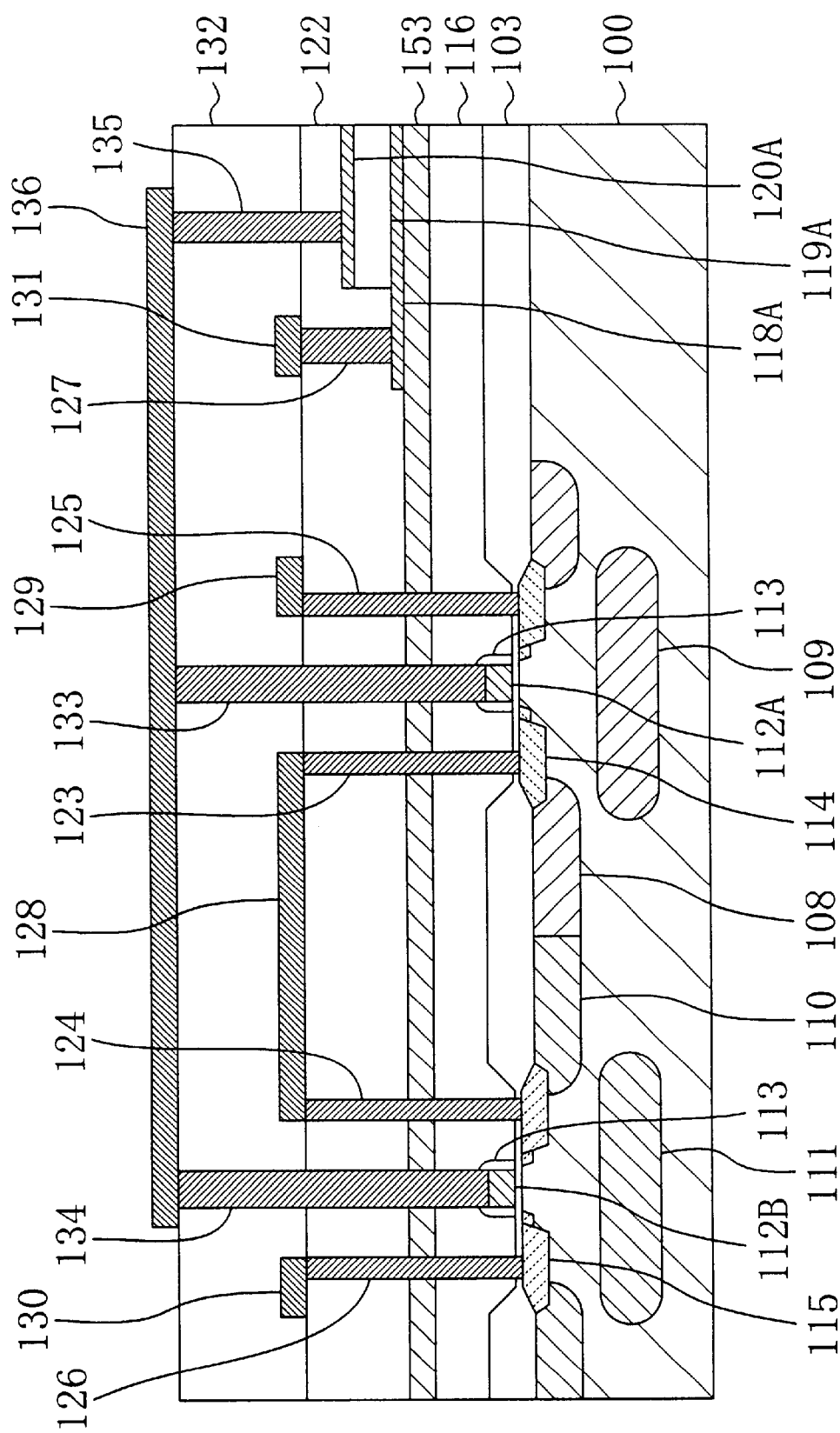
FIG. 10 is a cross-sectional view illustrating a principal portion of an FPGA according to a third embodiment of the present invention.

FIG. 10 illustrates a cross-sectional structure of the principal portion of an FPGA according to a third exemplary embodiment of the present invention, in which the switching device and nonvolatile memory device are implemented as CMOS circuit and ferroelectric memory, respectively.

In describing the third embodiment, the same components as those of the first embodiment shown in FIG. 4 are identified by the same reference numerals, and the description thereof will be omitted herein.

According to the third embodiment, an anti-diffusion layer 153 is formed between the first interlevel insulating film 116 of TEOS and the lower electrode 118A of the nonvolatile memory device. The anti-diffusion layer 153 is provided for preventing metal atoms contained in the capacitive insulating film 119A (or the ferroelectric thin film 119) from passing through the lower electrode 118A to diffuse into the first interlevel insulating film 116. The anti-diffusion layer 153 is preferably made of silicon nitride, aluminum oxide or silicon oxynitride.

In general, the higher substrate temperature of depositing the ferroelectric thin film 119, the better the ferroelectric thin film 119 improves. However, at an elevated temperature, a great number of metal atoms, which are contained in the ferroelectric thin film 119, diffuse into the first interlevel insulating film 116. As a result, the insulation properties of the first interlevel insulating film 116 deteriorate and the electrical characteristics of the CMOS circuits, which is a logic circuit, are adversely affected.

According to the third embodiment, the anti-diffusion layer 153 is provided between the first interlevel insulating film 116 and the lower electrode 118A. Thus, the deposition temperature of the ferroelectric thin film 119 can be raised without deteriorating the insulation properties of the first interlevel insulating film 116. Accordingly, the quality of the ferroelectric thin film 119 can be improved.

The present inventors evaluated the electrical characteristics of a CMOS circuit with a lead zirconate titanate film deposited as the ferroelectric thin film 119 directly on a silicon oxide film (e.g., the TEOS film). The present inventors also evaluated the electrical characteristics of a CMOS circuit with a lead zirconate titanate film formed over the silicon oxide film (e.g., the TEOS film) with a silicon nitride film interposed therebetween as the anti-diffusion layer. As a result, a considerable variation in gate threshold voltage was observed in the CMOS circuit of the former type, but substantially no variation was observed in the electrical characteristics of the latter CMOS circuit.

It should be noted that the same effects are attainable if the anti-diffusion layer 153 is made of aluminum oxide or silicon oxynitride.

What is claimed is:

1. A field-programmable gate array comprising:

first and second basic cells, each of which includes a plurality of logic circuits and is formed on a semiconductor substrate; and a program element for connecting/disconnecting the first and second basic cells to/from each other responsive to a program externally input and for storing thereon the connection or disconnection state between the first and second cells, wherein the program element includes:

a switching device, which is formed on the semiconductor substrate and turns ON/OFF to connect/disconnect the first and second basic cells to/from each other; and a nonvolatile memory device for storing thereon the ON/OFF states of the switching device, the memory device including a lower electrode, a capacitive insulating film made of a ferroelectric thin film, and an upper electrode, and wherein an interlevel insulating film is formed over the first and second basic cells and the switching device, and wherein a buffer layer for matching a lattice constant of the interlevel insulating film with that of the ferroelectric thin film is formed on the interlevel insulating film, and wherein the nonvolatile memory device is formed on the buffer layer.

2. The field-programmable gate array of claim 1, wherein the ferroelectric thin film is made of lead zirconate titanate, barium titanate or bismuth strontium tantalate, and wherein the lower electrode is made of at least one of the group consisting of: platinum: ruthenium; rhenium; osmium; iridium; and a metal oxide thereof.

3. The field-programmable gate array of claim 1, wherein the buffer layer is made of titanium, titanium nitride, tungsten nitride or magnesium oxide.

4. The field-programmable gate array of claim 1, wherein the buffer layer includes first and second buffer layers, which are formed on the interlevel insulating film in this order, and wherein the first buffer layer is made of titanium, titanium nitride, tungsten nitride or magnesium oxide, and wherein the second buffer layer is made of lead lanthanum titanate or bismuth oxide, and wherein the thickness of the second buffer layer is 20 nm or less.

5. A field-programmable gate array comprising:

first and second basic cells, each of which includes a plurality of logic circuits and is formed on a semiconductor substrate; and a program element for connecting/disconnecting the first and second basic cells to/from each other responsive to a program externally input and for storing thereon the connection or disconnection state between the first and second cells, wherein the program element includes:

a switching device, which is formed on the semiconductor substrate and turns ON/OFF to connect/disconnect the first and second basic cells to/from each other; and a nonvolatile memory device for storing thereon the ON/OFF states of the switching device, the memory device including a lower electrode, a capacitive insulating film made of a ferroelectric thin film, and an upper electrode, and wherein an interlevel insulating film is formed over the first and second basic cells and the switching device, and wherein an anti-diffusion layer is formed on the interlevel insulating film to prevent metal atoms in the ferroelectric thin film from diffusing into the interlevel insulating film, and wherein the nonvolatile memory device is formed on the anti-diffusion layer.

6. The field-programmable gate array of claim 5, wherein the ferroelectric thin film is made of lead zirconate titanate, barium titanate or bismuth strontium tantalate, and wherein the lower electrode is made of at least one of the group consisting of: platinum; ruthenium; rhenium; osmium; iridium; and a metal oxide thereof.

7. The field-programmable gate array of claim 5, wherein the anti-diffusion layer is made of silicon nitride, aluminum oxide or silicon oxynitride.

* * * * *